United States Patent
Liao et al.

(10) Patent No.: US 7,566,628 B2
(45) Date of Patent: Jul. 28, 2009

(54) PROCESS FOR MAKING A RESISTIVE MEMORY CELL WITH SEPARATELY PATTERNED ELECTRODES

(75) Inventors: Dongxiang Liao, Sunnyvale, CA (US); Suzette K. Pangrle, Cupertino, CA (US); Chakku Gopalan, Santa Clara, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/763,510

(22) Filed: Jun. 15, 2007

(65) Prior Publication Data

US 2008/0308781 A1    Dec. 18, 2008

(51) Int. Cl.
*H01L 21/20* (2006.01)
(52) U.S. Cl. .................. 438/393; 438/250; 438/253; 438/386; 438/E21.09
(58) Field of Classification Search ......... 438/393–396, 438/386–387, 243–244, 250–254
See application file for complete search history.

(56) References Cited

U.S. PATENT DOCUMENTS

| | | | | |
|---|---|---|---|---|
| 5,585,300 | A * | 12/1996 | Summerfelt | 505/330 |
| 6,329,234 | B1 * | 12/2001 | Ma et al. | 438/210 |
| 6,764,915 | B2 * | 7/2004 | Lee | 438/396 |
| 2004/0224474 | A1 * | 11/2004 | Barth et al. | 438/396 |

* cited by examiner

*Primary Examiner*—Dung A. Le
(74) *Attorney, Agent, or Firm*—Turocy & Watson, LLP

(57) ABSTRACT

Methods of making MIM structures and the resultant MIM structures are provided. The method involves forming a top electrode layer over a bottom electrode and an insulator on a substrate and forming a top electrode by removing portions of the top electrode layer. The bottom electrode, insulator, or combination thereof is isolated from the top electrode forming process, thereby mitigating damage to the resultant metal-insulator-metal structure. The resultant MIM structure can be a portion of a resistive memory cell.

18 Claims, 4 Drawing Sheets

PROCESS FOR MAKING A RESISTIVE MEMORY CELL WITH SEPARATELY PATTERNED ELECTRODES

TECHNICAL FIELD

Described are methods of making metal-insulator-metal (MIM) structures and the resultant MIM structures.

BACKGROUND

In the semiconductor industry, there is a continuing trend toward higher device densities. To achieve these high densities there have been, and continue to be, efforts toward scaling down device dimensions (e.g., at sub-micron levels) on semiconductor wafers and to increase the number of layers of such devices on a chip. In order to accomplish such high device packing densities, smaller and smaller feature sizes are required. This may include the width and spacing of interconnecting lines, spacing and diameter of contact holes, and the surface geometry, such as corners and edges, of various features.

The increasing demand for miniaturization in the integrated circuits industry has led to an ever constant reduction in the size of integrated circuit (IC) components. Such reduction in the size of the components provides for lower cost manufacture due to smaller chip size and increased yield, as well as improved circuit performance in many instances. However, reduction in the size of some integrated circuit devices can lead to undesired results. For example, edges/corners of small components/layers are susceptible to failure in both wafer processing and device operation. The susceptibility of edges/corners of components/layers may cause undesirable current leakage.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

One aspect of the subject invention provides a method for making a MIM structure on a substrate. The MIM structure can be used as a memory cell. Another aspect of the subject invention provides a method of preventing damage to an edge, corner, and/or interface of or within a MIM structure during processing the MIM structure. The methods involve forming a top electrode layer over an insulator and a bottom electrode on the substrate and then forming a top electrode by removing portions of the top electrode layer. During the process of removing the portions of the top electrode layer, the bottom electrode and/or insulator are isolated and thus unaffected by the removal process.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

Figure 1:
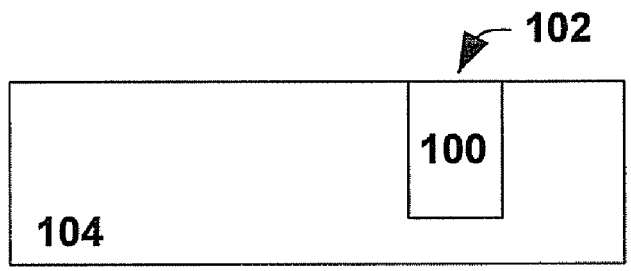
FIG. 1 illustrates a cross sectional view of an intermediate state of a portion of an exemplary MIM fabrication process in accordance with a first aspect of the invention.

Exposure of edges, corners, and layer interfaces with chemicals including air sometimes results in significant damage to the edge, corner, and/or interface of components/layers of a semiconductor structure including contamination, depletion, or void formation during processing the semiconductor structure. Such damage has a negative impact on the quality of the manufactured chip by altering the desired electrical properties of and interactions between components on the manufactured chip.

Semiconductors or integrated circuits (commonly called ICs, or chips) may contain a MIM structure. A MIM structure is a three-layered structure of two metal layers sandwiching an insulator layer. The MIM structure is typically formed by depositing three layers sequentially; first a metal layer, then an insulator layer, and finally a second metal layer. The MIM tri-layer is patterned into MIM structures by etching. The MIM tri-layer etching process is often problematic and limited in its usefulness. For example, it is often difficult to etch the MIM tri-layer cleanly due to differences in etching rates amongst the three layers. Specifically, it is difficult to etch a MIM tri-layer when a bottom electrode material is different from a top electrode material. Even if the MIM tri-layer etch can be managed (advances in effectively etching both metal layers), there is often damage to the insulator layer or the sidewall of the MIM structure. Moreover, the susceptibility of the edges and/or corners of the resultant MIM structure warrants protection of the edges and/or corners by encapsulation. However, the encapsulation process itself may damage the edges and/or corners.

One advantage of the subject invention is improving the performance and reliability of a MIM structure. By mitigating (e.g., reducing, eliminating, and preventing) damage to the MIM structure during its formation, high quality MIM structures can be provided. As described herein, a MIM structure is made without patterning a three-layer (e.g., metal, insulator, and metal) structure. Moreover, a MIM structure is made without patterning a two-layer structure containing an insulator layer and a metal layer. As a result, the edges and/or corners of the insulator in the resultant MIM structure are not contaminated by conductive materials of the metal layers.

A MIM structure is made by patterning a bottom electrode and a top electrode independently from each other (in separate acts). A suitable patterning technique can be developed for each electrode depending upon, for example, the constituents and thickness of the electrode material. As a result, patterning methods for each of the bottom electrode and top electrode can be tailored independently. Use of tailored patterning techniques means that an increasing number of combinations of the bottom electrode and top electrode materials are allowed when forming the MIM structure.

In the MIM fabrication process, since the edges, corners and/or interfaces are not contacted with layer-forming elements and/or etching chemistry, damage to the MIM structure can be mitigated. For example, since the edges and/or corners of the partially formed MIM structure are covered with a material when forming and/or patterning the top electrode, damage to the edges and/or corners can be mitigated. In another embodiment, the interface between a bottom electrode and an insulator of the resultant MIM structure is not exposed to the top electrode formation process. This is because the bottom electrode is formed (e.g., patterned) prior to depositing the top electrode material on the substrate.

The MIM solutions described herein can be applied to any suitable semiconductor structure such as any suitable type of memory cell. In one embodiment, the MIM solutions can be applied to resistive memories. Resistive memories represent data using an electrical resistance of a resistive memory element (e.g., an insulator layer). One group of resistive memory technologies is a resistive switching RAM (random access memory) such as ReRAM or RRAM (resistive random access memory), PCRAM (programmable conductive random access memory), and the like. These memories typically are a two terminal resistor that can change its resistivity between ON and OFF or more intermediate states under certain external signal (e.g., electrical field, current, heat, magnetization, pressure, and the like). The different resistance values represent the information stored in the memories. These resistance memory technologies can have the ability to provide non-volatile or semi-volatile random access memory devices which require no, or infrequent, refreshing.

The innovation is now described with reference to the drawings, wherein like reference numerals are used to refer to like elements throughout. In the following description, for purposes of explanation, numerous specific details are set forth in order to provide a thorough understanding of the subject invention. It may be evident, however, that the invention can be practiced without these specific details. In other instances, well-known structures and devices are shown in block diagram form in order to facilitate describing the invention. Referring to FIGS. 1 to 4, FIGS. 5 to 8, FIGS. 9 to 12, and FIGS. 13 to 16, four of many possible exemplary embodiments of making MIM structures are specifically illustrated.

FIG. 1 illustrates forming a bottom electrode 100 in an opening 102 of the substrate 104. The substrate 104 may contain any suitable substrate material on which electric device such as a transistor can be formed. Examples of substrate materials include a semiconductor material (e.g., Group IV semiconductors such as silicon and germanium; Group III-V semiconductors such as gallium arsenide and indium phosphide; Group II-VI semiconductors; and polysilicon), an oxide material (e.g., silicon dioxide, magnesium oxide, and indium-tin-oxide), sapphire, glass, ceramics, polymeric resins (e.g., polyamide), and the like. Typically, the substrate 104 contains silicon, optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc.

When a resultant MIM structure is a capacitor, the substrate 104 can be a dielectric layer. Any suitable dielectric material can be used as the substrate 104. Both organic and inorganic dielectric materials may be used. Similarly, both low and high k dielectrics may be used.

The bottom electrode 100 can be formed by depositing a bottom electrode material in the substrate 104. In this example, the bottom electrode 100 is formed in a patterned opening 102 in the substrate 104. The term "opening" in this context refers to vias, lines, trenches, contact holes, and the like. In one embodiment, the openings 102 are vias. The opening 102 can be formed by employing any suitable techniques. For example, the opening 102 can be formed by lithography and etching techniques. In one embodiment, the bottom electrode 100 can be formed using a damascene process.

The opening 102 can be filled with a first electrically conductive material, thereby forming the bottom electrode 100 in the substrate 104. Examples of conductive materials include metals, metal alloys, metal compounds such as metal oxides, metal nitrides, and metal sulfides, carbon, conductive polymers, and the like. Specific examples of electrically conductive materials include aluminum (Al), gold (Au), platinum (Pt), copper (Cu), silver (Ag), cobalt (Co), iridium (Ir), tungsten (W), and molybdenum (Mo), ruthenium (Ru), nickel (Ni), nickel oxide (NiO), palladium (Pd), tantalum (Ta), tantalum nitride (TaN), titanium (Ti), titanium nitride (TiN), cobalt oxide (CoO), combinations and alloys thereof, and the like.

The opening 102 can be filled with the first conductive materials by any suitable techniques. For example, physical vapor deposition (PVD), chemical vapor deposition (CVD), electroplating, electroless filling, sputtering, evaporation, and the like can be used to fill the opening 102 with the materials. In one embodiment, where the conductive material is copper, the filling may include formation of a Cu seed layer. Once the Cu seed layer is formed the remainder of the Cu filling is completed using techniques such as evaporation, CVD, electroplating, electroless plating and the like. Optionally, the conductive material may undergo a thermal annealing.

After filling the opening 102 with the conductive material, if desired, unwanted portions of the conductive material such as the conductive material outside the opening 102 can be removed by, for example, polishing or etching, thereby confining the conductive material substantially to the opening 102. When the conductive material outside the opening 102 is removed by polishing, polishing can be performed using any suitable method. For example, chemical, mechanical, or chemical mechanical polishing (CMP) can be used.

When the conductive material outside the opening 102 is removed by etching, the etches can be carried out using any suitable etchant. For example, etching can be by a wet etch or a dry etch. Dry etching may include plasma etching, reactive ion etching (RIE), and the like. When the conductive material contains metal, a metal etch can be carried out using a suitable etchant chemistry and etchants. For example, any suitable Cl-based gas such as $Cl_2$, $BCl_3$, or HCl can be used as metal etchants. In another example, Br-based etchants such as HBr can be used. Additives such as $N_2$, $O_2$, Ar, He, or any other noble gas can be included. In yet another embodiment, combinations of Cl— and Br-based gases such as HCl and HBr, or combinations of Cl— and F-based gases such as $Cl_2$ and $CF_4$ can be used.

Optionally, the substrate 104 can be washed or cleaned after polishing or etching to remove chemistries such as polishing slurry, etchants, and other materials using known methods and materials.

Figure 2:
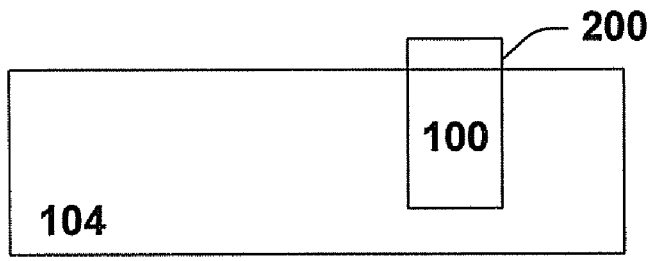
FIG. 2 illustrates forming an insulator over a bottom electrode on a substrate in accordance with a first aspect of the subject invention.

FIG. 2 illustrates forming an insulator 200 on the bottom electrode 100. The insulator 200 can contain any suitable electrically insulative material including organic insulative materials, inorganic insulative materials, and composites of both organic and inorganic insulative materials. Examples of organic insulators include polyimides, benzocyclobutenes, parylenes, polyacrylates, polyvinylbutyrals, polyvinylphenols, and the like. Examples of inorganic insulators include nitrides and oxides. Specific examples of nitrides and oxides include silicon oxide ($SiO_2$), silicon nitride (SiN), tantalum oxide ($Ta_2O_5$), yttrium oxide ($Y_2O_3$), zirconium oxide ($ZrO_2$), silicon oxynitride (SiON), aluminum oxide ($Al_2O_3$), titanium oxide ($TiO_2$), barium strontium titanium oxide ($BaSrTiO_3$), and refractory metal oxides such as tantalum oxide ($Ta_2O_5$), and the like.

The insulator 200 has a suitable resistivity that depends upon the desired implementations and/or the semiconductor structure being fabricated. When the subsequently formed MIM structure is a portion of resistive memories and the insulator 200 is used as a resistive layer in the resistive memories, the insulator 200 can have multi-resistive states. The resistance of the insulator 200 can be changed by an external signal (e.g., electrical field, current, heat, magnetization, pressure, and the like), thereby storing a binary data bit. For example, the insulator 200 has a high resistance value and a low resistance value depending on the external signal. The high resistance value may represent an ON state of resistive memories, and the low resistance value may represent an OFF state of resistive memories.

In one embodiment, the insulator 200 has a high resistivity of about 2 k$\Omega$ or more and about 100 k$\Omega$ or less and a low resistivity of about 10$\Omega$ or more and about 1 k$\Omega$ or less. In another embodiment, the insulator 200 has a high resistivity of about 3 k$\Omega$ or more and about 50 k$\Omega$ or less and a low resistivity of about 50$\Omega$ or more and about 900$\Omega$ or less. In yet another embodiment, the insulator 200 has a high resistivity of about 4 k$\Omega$ or more and about 30 k$\Omega$ or less and a low resistivity of about 100$\Omega$ or more and about 800$\Omega$ or less.

The insulator 200 has a suitable relative permittivity that depends upon the desired implementations and/or the semiconductor structure being fabricated. In one embodiment, the insulator 200 has a relative permittivity of about 3 or more. In another embodiment, the insulator 200 has a relative permittivity of about 5 or more. In yet another embodiment, the insulator 200 has a relative permittivity of about 8 or more.

The insulator 200 has a suitable thickness that depends upon the desired implementations and/or the semiconductor structure being fabricated. The resistivity of the insulator 200 is proportional to the thickness of the insulator 200. Additionally, when the insulator 200 contains multi-resistive materials, a voltage at which the insulator 200 switches resistive states is dependent upon its thickness. Thus, the thickness of the insulator 200 can be suitably selected depending on, for example, the desired resistivity and/or the desired voltage at which the insulator 200 changes resistive states.

In one embodiment, the insulator 200 has a thickness of about 10 Angstroms or more and about 1,000 Angstroms or less. In another embodiment, the insulator 200 has a thickness of about 20 Angstroms or more and about 500 Angstroms or less. In yet another embodiment, the insulator 200 has a thickness of about 40 Angstroms or more and about 300 Angstroms or less.

The insulator 200 can be formed by any suitable method. In one embodiment, the insulator 200 is formed by oxidation techniques (e.g., thermal oxidation, plasma-assisted oxidation, and the like) and/or deposition techniques (e.g., CVD, spin-on techniques, sputtering, and the like). The insulator oxide can be grown from the bottom electrode 100 under any suitable conditions that depends on, for example, the constituents of the bottom electrode 100. For example, the insulator oxide can be formed by thermally growing the oxide in an oxygen-steam atmosphere at an elevated temperature. When the insulator 200 is formed by growing an oxide from the bottom electrode 100, the method for forming the insulator 200 may advantageously not involve removing (e.g., etching) unwanted portions of the insulator material.

In another embodiment, the insulator 200 is formed by forming a layer containing an insulative material and then patterning the insulator layer over the bottom electrode 100. The insulator layer can be deposited over the substrate 104 by any suitable techniques. For example, CVD, plasma enhanced chemical vapor deposition (PECVD), low pressure chemical vapor deposition (LPCVD), high pressure chemical vapor deposition (HPCVD) methods can be used. The insulator layer can also be formed by using spin-coating, dip-coating, spraying, or the like.

After forming the insulator layer over the substrate 104, portions of the insulator layer not over the bottom electrode 100 can be removed by, for example, lithography and etching techniques, thereby forming the insulator 200. For example, the insulator 200 can be formed by depositing a resist on the insulator layer, exposing the resist to a pattern of radiation, developing the resist into the pattern, and etching the exposed portions of the insulator layer not covered by the resist.

Etching the exposed portions of the insulator layer can be carried out using any suitable etchants. The etches can be wet or dry etches. For example, when the insulator layer contains an oxide, wet oxide etching can be carried out in solutions containing buffered, or diluted hydrofluoric acid (HF) such as a hydrofluoric acid-ammonium fluoride buffered solution (BHF). Other etchants can also be used as long as they are capable of removing the exposed portions of the insulator layer, but they do not substantially damage and/or remove other components/layers such as the bottom electrode 100 and the substrate 104.

Since at least a portion of the bottom electrode 100 is covered with the insulator layer during removing the exposed portions of the insulator layer, the interface between the bottom electrode 100 and insulator 200 is not exposed to the insulator forming process. As a result, the bottom electrode 100 is not substantially damaged by the insulator forming process.

The resultant insulator 200 can have any suitable shape, size, pattern, array or design on the bottom electrode 100. In one embodiment, the insulator 200 is formed on the entire upper surface of the bottom electrode 100. In another embodiment, the insulator 200 is formed on at least a portion of the upper surface of the bottom electrode 100 (not shown).

The insulator forming process starts after the formation of the bottom electrode 100, the insulator 200 is not exposed to any bottom electrode forming process (e.g., patterning a bottom electrode such as etching a bottom electrode). As a result, the insulator 200 is not damaged by bottom electrode forming processes. For example, the insulator 200 is not contaminated by an electrically conductive material of a bottom electrode.

Figure 3:
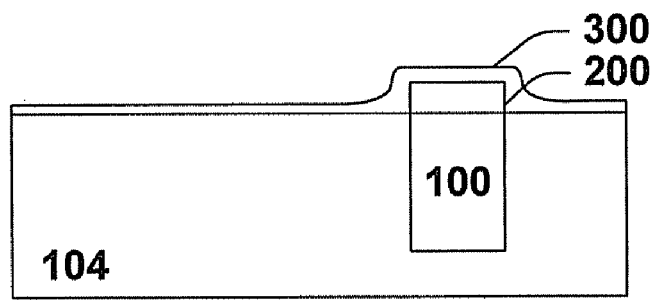
FIG. 3 illustrates forming a top electrode layer over the insulator in accordance with a first aspect of the subject invention.

FIG. 3 illustrates forming a top electrode layer 300 over the insulator 200 on the substrate 104. The top electrode layer 300 contains a second electrically conductive material. For example, the top electrode layer 300 contains any of the electrically conductive materials described in connection with the bottom electrode 100 in FIG. 1. In one embodiment, the conductive material of top electrode is different from the conductive material of the bottom electrode 100. In another embodiment, the conductive material of top electrode is the same as the conductive material of the bottom electrode 100. Since the bottom electrode 100 is covered with the insulator 200, the interface of the bottom electrode 100 and the insulator 200 is not exposed to the top electrode layer forming process. As a result, the interface of the bottom electrode 100 and the insulator 200 is not damaged by the top electrode layer forming process.

The top electrode layer 300 has a suitable thickness that depends upon the desired implementations and/or the semiconductor structure being fabricated. The thickness of the top electrode layer 300 may vary and is not critical to the subject invention. In one embodiment, the top electrode layer 300 has a thickness of about 100 Angstroms or more and about 10,000 Angstroms or less. In another embodiment, the top electrode layer 300 has a thickness of about 150 Angstroms or more and about 5,000 Angstroms or less. In yet another embodiment, the top electrode layer 300 has a thickness of about 200 Angstroms or more and about 2,000 Angstroms or less.

The top electrode layer 300 can be formed by any suitable techniques over the substrate 104. For example, PVD, CVD, electroplating, electroless filling, sputtering, evaporation, and the like can be used to form the top electrode layer 300.

Figure 4:
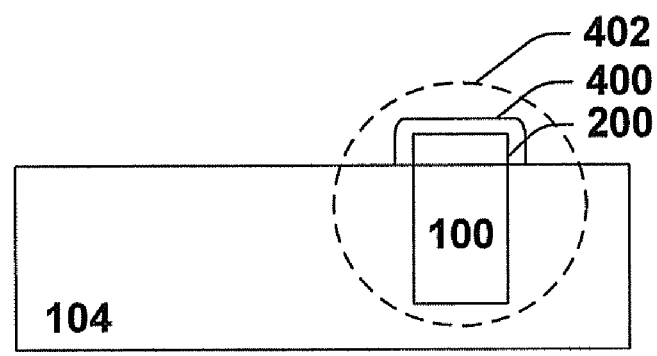
FIG. 4 illustrates forming a top electrode by removing portions of the top electrode layer in accordance with a first aspect of the subject invention.

FIG. 4 illustrates forming a top electrode 400 by patterning the top electrode layer 300, thereby forming a MIM structure 402. In one embodiment, the MIM structure 402 is a portion of a resistive memory cell (e.g., a resistive switching RAM such as ReRAM, RRAM, PCRAM, and the like). The top electrode layer 300 can be patterned by removing portions of the top electrode layer 300 that are not over/around the insulator 200. The portions of the top electrode layer 300 can be removed by, for example, lithography and etching techniques. For example, the top electrode 400 can be formed by depositing a resist on the top electrode layer 300, exposing the resist to a pattern of radiation, developing the resist into the pattern, and removing the exposed portions of the top electrode layer 300 not covered by the resist.

Any suitable method can be used to remove the unwanted portions of the top electrode layer 300. For example, the unwanted portions of the top electrode layer 300 can be removed by etching. Etching can be through either a wet etch or a dry etch. In one embodiment, the unwanted portions of the top electrode layer 300 is removed by using a plasma etch, wet etch, or electro polishing. In another embodiment, the unwanted portions of the top electrode layer 300 is removed by a RIE process. For example, source materials of $BCl_3$ and $SF_6$ are used to generate Cl— and F— ions to facilitate dry etching of the exposed portions of the top electrode layer 300.

In yet another embodiment, the unwanted portion of the top electrode layer 300 is removed by a wet etchant. The etchant chemistry employed to remove the unwanted portion of the top electrode layer 300 depends on the etch requirements and the constituents of the top electrode 400. The etching can be either isotropic or anisotropic. In one embodiment, a peroxide based etchant is used. In another embodiment, an acid based etchant is used. In yet another embodiment, an etchant containing both an acid and a peroxide is used. For example, a mixture of sulfuric acid and hydrogen peroxide can be used as a wet etchant. In another embodiment, an etchant containing halogen compounds is used. The etch may be followed by a cleaning act.

The resultant top electrode 400 can have any suitable shape, size, pattern, array or design on the insulator 200 so that at least a portion of the top electrode 400 is directly over the bottom electrode 100. The top electrode 400 and bottom electrode 100 are not in contact with each other. The insulator 200 separates the bottom electrode 100 from the top electrode 400. In one embodiment, the top electrode 400 is formed over the entire upper surface of the insulator 200. In another embodiment, the top electrode 400 is formed on at least a portion of the upper surface of the insulator 200 (not shown).

Since at least a portion of the bottom electrode 100 and/or insulator 200 are covered with the top electrode layer 300 during the top electrode forming process, the bottom electrode 100 and/or insulator 200 are isolated from the top electrode forming process. That is, the bottom electrode 100 and/or insulator 200 are not exposed to the top electrode forming process (e.g., patterning the top electrode layer 300 such as etching the top electrode layer 300). As a result, the bottom electrode 100 and/or insulator 200 are not substantially damaged by the top electrode forming process. For example, since the interface of the bottom electrode 100 and insulator 200 is not exposed to the top electrode forming process, the bottom electrode 100 and/or insulator 200 are not substantially damaged by the top electrode forming process. In another embodiment, since edges and/or corners of the bottom electrode 100 and/or insulator 200 are covered with the top electrode layer 300 during the top electrode forming process, the bottom electrode 100 and/or insulator 200 are not substantially damaged by the top electrode forming process.

Figure 5:
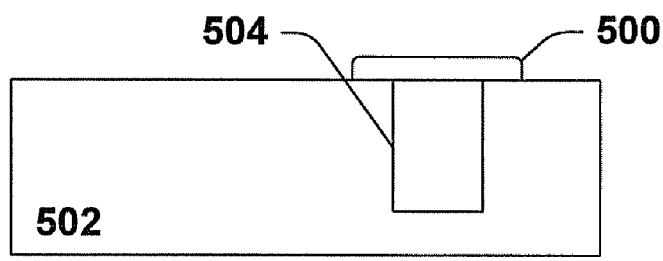
FIG. 5 illustrates a cross sectional view of an intermediate state of a portion of another exemplary MIM fabrication process in accordance with a second aspect of the invention.

FIG. 5 illustrates a cross sectional view of an intermediate state of another exemplary MIM fabrication process. Specifically, FIG. 5 illustrates forming a bottom electrode 500 on a substrate 502. The substrate 502 may or may not contain an opening 504. Examples of openings 504 include vias, lines, trenches, contact holes, and the like. The opening 504 can be formed in the same manner described in connection with the opening 102 in FIG. 1. The opening 504 can contain any suitable device or material such as an electrically conductive material, an electrically semi-conductive material, or a dielectric material.

The bottom electrode 500 can contain any suitable electrically conductive material. For example, the bottom electrode 500 contains any of the materials described in connection with the bottom electrode 100 in FIG. 1. The bottom electrode 500 can be formed over the opening 504 by any suitable method, for example, forming a bottom electrode layer containing an electrically conductive material and then patterning the bottom electrode layer over the opening 504. For example, the bottom electrode 500 can be formed in the same manner described in connection with the top electrode 400 in FIGS. 3 and 4.

Figure 6:
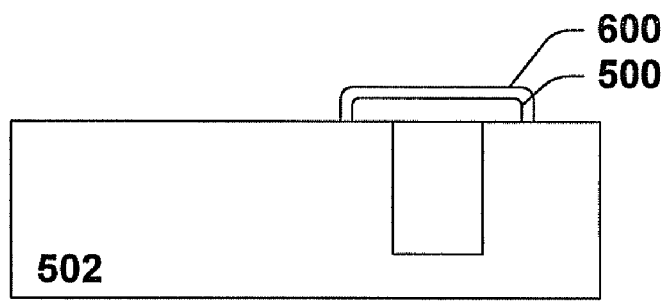
FIG. 6 illustrates forming an insulator over a bottom electrode on a substrate in accordance with a second aspect of the subject invention.

FIG. 6 illustrates forming an insulator 600 over the bottom electrode 500 on the substrate 502. The insulator 600 can contain any suitable insulative material. For example, the insulator 600 contains any of the materials described in connection with the insulator 200 in FIG. 2. The insulator 600 can be formed over the bottom electrode 500 by any suitable method, for example, thermal oxidation techniques or deposition techniques such as CVD or spin-on techniques. For example, the insulator 600 can be formed in the same manner described in connection with the insulator 200 in FIG. 2.

In one embodiment, the insulator 600 is formed on the entire upper surface of the bottom electrode 500. In another embodiment, the insulator 600 is formed on at least a portion of the upper surface of the bottom electrode 500 (not shown). When the insulator 600 is formed by depositing an insulator layer over the substrate 104 and removing portions of the insulator layer not over the bottom electrode 500, the bottom electrode 500 is not substantially damaged by patterning the insulator 600 since at least a portion of the bottom electrode 500 is covered with the insulator material. Moreover, the insulator forming process starts after the formation of the bottom electrode 500, the insulator 600 is not exposed to any bottom electrode forming process (e.g., patterning a bottom electrode such as etching a bottom electrode). As a result, the insulator 600 is not damaged by bottom electrode forming processes. For example, the insulator 600 is not contaminated by an electrically conductive material of a bottom electrode.

Figure 7:
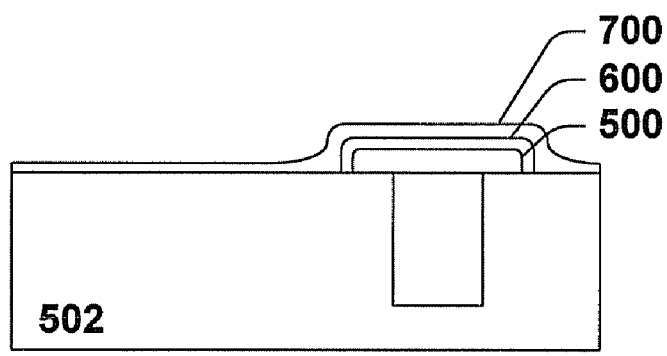
FIG. 7 illustrates forming a top electrode layer over the insulator in accordance with a second aspect of the subject invention.

FIG. 7 illustrates forming a top electrode layer 700 over the insulator 600 on the substrate 502. The top electrode layer 700 can contain any suitable electrically conductive material. For example, the top electrode layer 700 contains any of the materials described in connection with the bottom electrode 100 in FIG. 1. In one embodiment, the conductive material of top electrode layer 700 is different from the conductive material of the bottom electrode 500. In another embodiment, the conductive material of top electrode layer 700 is the same as the conductive material of the bottom electrode 500.

The top electrode layer 700 can be formed over the insulator 600 by any suitable method. For example, the top electrode layer 700 can be formed in the same manner described in connection with the top electrode layer 300 in FIG. 3. Since the bottom electrode 500 is covered with the insulator 600, the interface of the bottom electrode 500 and the insulator 600 is not exposed to the top electrode layer forming process. As a result, the interface of the bottom electrode 500 and the insulator 600 is not damaged by the top electrode layer forming process.

Figure 8:
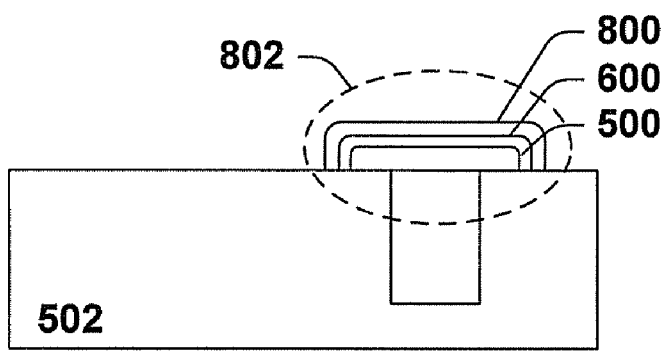
FIG. 8 illustrates forming a top electrode by removing portions of the top electrode layer in accordance with a second aspect of the subject invention.

FIG. 8 illustrates forming a top electrode 800, thereby forming a MIM structure 802. In one embodiment, the MIM structure 802 is a portion of a resistive memory cell (e.g., a resistive switching RAM such as ReRAM, RRAM, PCRAM, and the like). The top electrode 800 can be formed from the top electrode layer 700 by any suitable method, for example, patterning the top electrode layer 700. For example, the top electrode 800 can be formed by removing portions of the top electrode layer 700 that are not over and/or near the insulator 600 in the same manner described in connection with the top electrode 400 in FIG. 4.

The resultant top electrode 800 can have any suitable shape, size, pattern, array or design on the insulator 600 so that at least a portion of the top electrode 800 is directly over the bottom electrode 500. The top electrode 800 and bottom electrode 500 are not in contact with each other. The insulator 600 separates the bottom electrode 500 from the top electrode 800. In one embodiment, the top electrode 800 is formed over the entire upper surface of the insulator 600. In another embodiment, the top electrode 800 is formed on at least a portion of the upper surface of the insulator 600 (not shown).

Since at least a portion of the bottom electrode 500 and/or insulator 600 are covered with the top electrode layer 700 during the top electrode forming process, the bottom electrode 500 and/or insulator 600 are isolated from the top electrode forming process. That is, the bottom electrode 500 and/or insulator 600 are not exposed to the top electrode forming process (e.g., patterning the top electrode layer 700 such as etching the top electrode layer 700). As a result, the bottom electrode 500 and/or insulator 600 are not substantially damaged by the top electrode forming process. For example, since the interface of the bottom electrode 500 and insulator 600 is not exposed to the top electrode forming process, the bottom electrode 500 and/or insulator 600 are not substantially damaged by the top electrode forming process. In another embodiment, since edges and/or corners of the bottom electrode 500 and/or insulator 600 are covered with the top electrode layer 700 during the top electrode forming process, the bottom electrode 500 and/or insulator 600 are not substantially damaged by the top electrode forming process.

Figure 9:
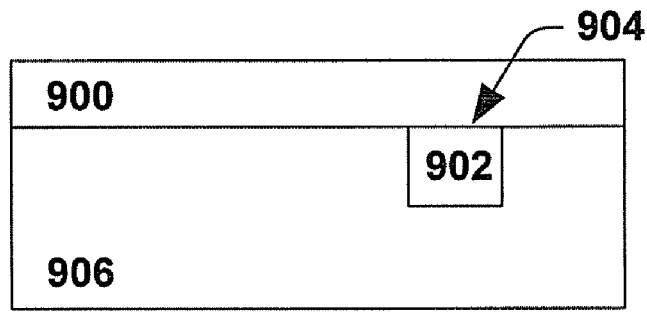
FIG. 9 illustrates a cross sectional view of an intermediate state of a portion of another exemplary MIM fabrication process in accordance with a third aspect of the invention.

FIG. 9 illustrates a cross sectional view of an intermediate state of another exemplary MIM fabrication process. Specifically, FIG. 9 illustrates forming a protecting layer 900 over a bottom electrode 902 on a substrate 906. The substrate 906 has an opening 904 formed therein and contains the bottom electrode 902 in the opening 904. The bottom electrode 902 can contain any suitable electrically conductive material. For example, the bottom electrode 902 contains any of the materials described in connection with the bottom electrode 100 in FIG. 1.

The protecting layer 900 contains any suitable material that may be formed into a pattern. Examples of protecting layer materials include silicon containing materials, such as silicon oxide, silicon nitride and silicon oxynitride; nitrogen rich films; photoresist materials; low K polymer materials; and the like. Low K polymer materials are materials having low dielectric constants and include polyimides, fluorinated polyimides, polysilsequioxane, benzocyclobutene (BCB), parlene F, parlene N and amorphous polytetrafluoroethylene. In another embodiment, the protecting layer 900 contains an oxide material such as a high density plasma (HDP) oxide and plasma tetraethyl orthosilicate (TEOS). The protecting layer 900 can be fabricated by forming the various materials over the substrate 906 via CVD, PVD, electroplating or electroless plating, and patterning the various material layers using lithography.

The protecting layer 900 can contain any suitable material so that an opening can be formed in the protecting layer 900 on the bottom electrode 902 in a subsequent process. That is, the protecting layer 900 can be selected so that there is etch selectivity between the protecting layer 900 and the bottom electrode 902. In one embodiment, the protecting layer material can have a higher etch rate than the bottom electrode in the subsequent opening forming process. For example, an etching rate of an oxide material is markedly higher than an etching rate of a metal material with respect to an oxide etchant. Accordingly, in one embodiment, the protecting layer 900 contains an oxide material when the bottom electrode 902 contains a metal material. Examples of oxide materials include silicon oxynitride, silicon oxide, and the like.

Figure 10:
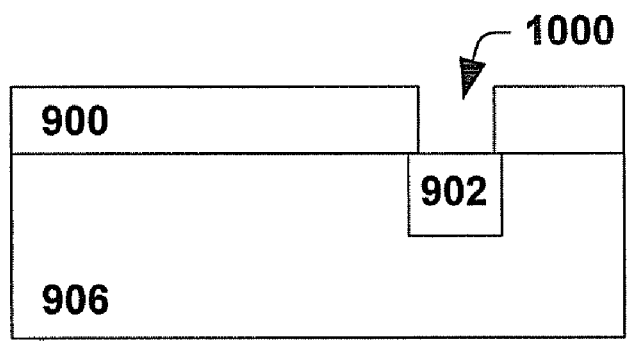
FIG. 10 illustrates forming an opening on a bottom electrode in a protecting layer in accordance with a third aspect of the subject invention.

FIG. 10 illustrates forming an opening 1000 in the protecting layer 900 on the top of the bottom electrode 902. In subsequent processes, an insulator and/or a top electrode can be formed on the bottom electrode 902 in the opening 1000 and the remaining protecting layer 900 (e.g., inside of the opening wall of the protecting layer 900) can serve as a mask for protecting the bottom electrode 902 while the subsequent processes.

The opening 1000 can be formed by any suitable techniques. For example, the opening 1000 can be formed by lithography and etching techniques. The opening 1000 can be formed by depositing a resist on the protecting layer 900, exposing the resist to a pattern of radiation, developing the resist into the pattern, and removing, for example, etching the exposed portions of the protecting layer 900 not covered by the resist. Any suitable etching process can be used for forming the opening 1000 as long as the etching process substantially removes the exposed portions of the protecting layer 900 to form the opening 1000 but does not substantially remove and/or damage the bottom electrode 902. For example, when the protecting layer 900 contains an oxide material and the bottom electrode 902 contains a metal material, an oxide etchant such as halogen acids (e.g., hydrofluoric acid) can be employed to form the opening 1000 without substantially removing and/or damaging the bottom electrode 902. In one embodiment, the opening 1000 is formed on at least a portion of the top surface of the bottom electrode 902. In another embodiment, the opening 1000 is formed on the entire top surface of the bottom electrode 902 (not shown).

Figure 11:
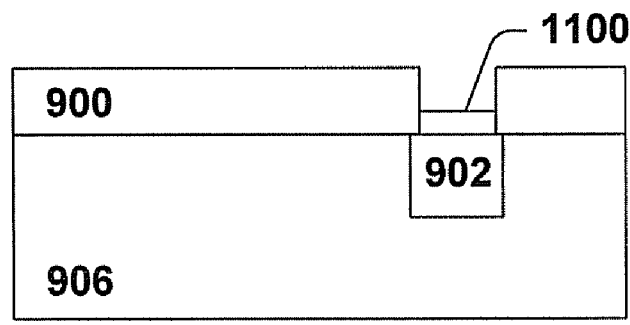
FIG. 11 illustrates forming an insulator in the opening on the bottom electrode in accordance with a third aspect of the subject invention.

FIG. 11 illustrates forming an insulator 1100 in the opening 1000 over a bottom electrode 902. The insulator 1100 can contain any suitable electrically insulative material. For example, the insulator 1100 contains any of the materials described in connection with the insulator 200 in FIG. 2. The insulator 1100 can be formed over the bottom electrode 902 by any suitable method, for example, thermal oxidation techniques or deposition techniques such as CVD or spin-on techniques. For example, the insulator 1100 can be formed in the same manner described in connection with the insulator 200 in FIG. 2. In one embodiment, the insulator 1100 is formed on the entire top surface of the bottom electrode 902. In another embodiment, the insulator 1100 is formed on at least a portion of the top surface of the bottom electrode 902 (not shown).

When the insulator 1100 is formed by depositing an insulator layer over the substrate 906 and removing unwanted portions of the insulator layer, the bottom electrode 902 is not substantially damaged by patterning the insulator 1100 since the bottom electrode 902 is covered with the insulator material during the insulator patterning process. Moreover, since the insulator 1100 can be formed after the formation of the bottom electrode 902, the insulator 1100 is not exposed to any bottom electrode forming process (e.g., patterning a bottom electrode such as etching a bottom electrode). As a result, the insulator 1100 is not damaged by bottom electrode forming processes. For example, the insulator 1100 is not contaminated by an electrically conductive material of a bottom electrode.

Although not shown in FIGS. 9-11, the insulator 1100 can be formed prior to forming the protecting layer 900. In one embodiment, the insulator 1100 is formed over the bottom electrode 902, the protecting layer 900 is formed over the substrate 906, and then the opening 1000 is formed in the protecting layer 900 on the bottom electrode 902. Then opening 1000 can be formed by, for example, lithography and etching techniques. In this embodiment, since the opening 1000 is not exposed to the insulator forming process, the opening 1000 is not substantially damaged by the insulator forming process.

Figure 12:
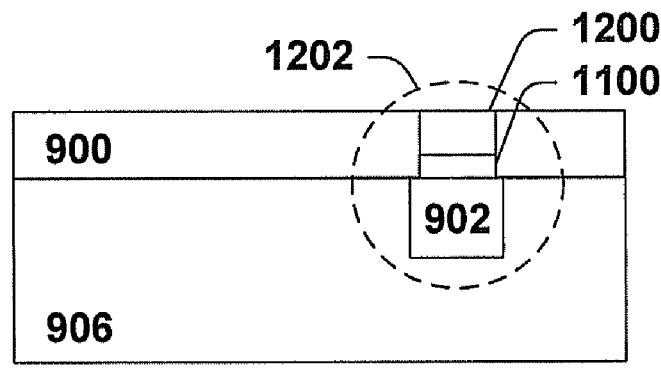
FIG. 12 illustrates forming a top electrode in the opening on the insulator in accordance with a third aspect of the subject invention.

FIG. 12 illustrates forming a top electrode 1200 in the opening 1000 on the insulator 1100, thereby forming a MIM structure 1202. In one embodiment, the MIM structure 1202 is a portion of a resistive memory cell (e.g., a resistive switching RAM such as ReRAM, RRAM, PCRAM, and the like). The top electrode 1200 can contain any suitable electrically conductive material. For example, the top electrode 1200 contains any of the materials described in connection with the bottom electrode 100 in FIG. 1. In one embodiment, the conductive material of top electrode 1200 is different from the conductive material of the bottom electrode 902. In another embodiment, the conductive material of top electrode 1200 is the same as the conductive material of the bottom electrode 902.

The top electrode 1200 is formed in the patterned opening 1000 of the protecting layer 900. The top electrode 1200 can be formed by any suitable techniques. For example, the top electrode 1200 is formed by patterning a top electrode material over the substrate 906. In one embodiment, the top electrode 1200 is formed by filling the opening 1000 with a top electrode material and removing unwanted portions of the top electrode material such as the top electrode material outside the opening 1000. The top electrode material outside the opening 1000 can be removed by, for example, polishing or etching, thereby confining the conductive material substantially to the opening 1000.

Since at least portions of the bottom electrode 902 and/or insulator 1100 are covered with the top electrode material and the protecting layer 900 during the top electrode forming process (e.g., patterning the top electrode 1200), the bottom electrode 902 and/or insulator 1100 are isolated from the top electrode forming process. That is, the bottom electrode 902 and/or insulator 1100 are not exposed to the top electrode forming process. As a result, the bottom electrode 902 and/or insulator 1100 are not substantially damaged by the top electrode forming process. For example, since the interface of the bottom electrode 902 and insulator 1100 is not exposed to the top electrode forming process, the bottom electrode 902 and/or insulator 1100 are not substantially damaged by the top electrode forming process. In another embodiment, since edges and/or corners of the bottom electrode 902 and/or insulator 1100 are covered with the top electrode material and the protecting layer 900 during the top electrode forming process, the bottom electrode 902 and/or insulator 1100 are not substantially damaged by the top electrode forming process.

Figure 13:
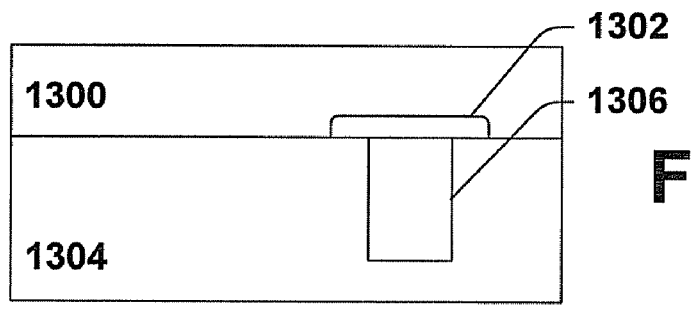
FIG. 13 illustrates a cross sectional view of an intermediate state of a portion of another exemplary MIM fabrication process in accordance with a fourth aspect of the invention.

FIG. 13 illustrates a cross sectional view of an intermediate state of another exemplary MIM fabrication process. Specifically, FIG. 13 illustrates forming a protecting layer 1300 over a bottom electrode 1302 on a substrate 1304. The substrate 1304 may or may not have an opening 1306 formed therein. Examples of opening 1306 include vias, lines, trenches, contact holes, and the like. The opening 1306 can be formed in the same manner described in connection with the opening 102 in FIG. 1. The opening 1306 can contain any suitable device or material such as an electrically conductive material, an electrically semi-conductive material, or a dielectric material.

The bottom electrode 1302 can be formed over the opening 1306 and contain any suitable electrically conductive material. For example, the bottom electrode 1302 contains any of the materials described in connection with the bottom electrode 100 in FIG. 1, and the bottom electrode 1302 can be formed in the same manner described in connection with the bottom electrode 500 in FIG. 5.

The protecting layer 1300 contains any suitable material that may be formed into a pattern. For example, the protecting layer 1300 contains any of the materials described in connection with the protecting layer 900 in FIG. 9, and the protecting layer 1300 can be formed in the same manner as described in connection with the protecting layer 900 in FIG. 9.

Figure 14:
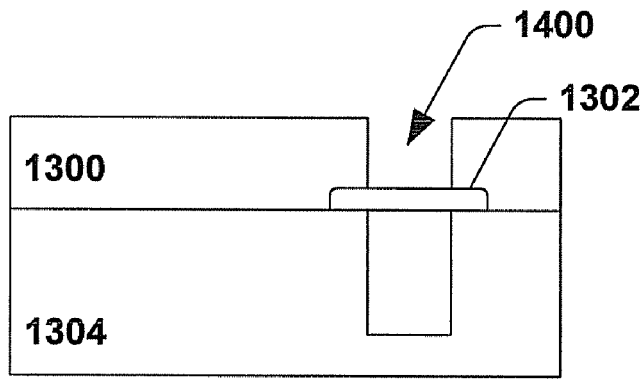
FIG. 14 illustrates forming an opening on a bottom electrode in a protecting layer in accordance with a fourth aspect of the subject invention.

FIG. 14 illustrates forming an opening 1400 in the protecting layer 1300 on the top of the bottom electrode 1302. The opening 1400 can be formed by any suitable techniques. For example, the opening 1400 can be formed in the same manner described in connection with the opening 1000 in FIG. 10. In one embodiment, the opening 1400 is formed on at least a portion of the top surface of the bottom electrode 1302. In another embodiment, the opening 1400 is formed on the entire top surface of the bottom electrode 1302 (not shown). While forming the opening 1400, the edges and/or corners of the bottom electrode 1302 may be slightly modified. For example, the edges and/or corners of the bottom electrode 1302 may be rounded. As a result, weak spots of the resultant MIM structure are reduced and/or eliminated.

Figure 15:
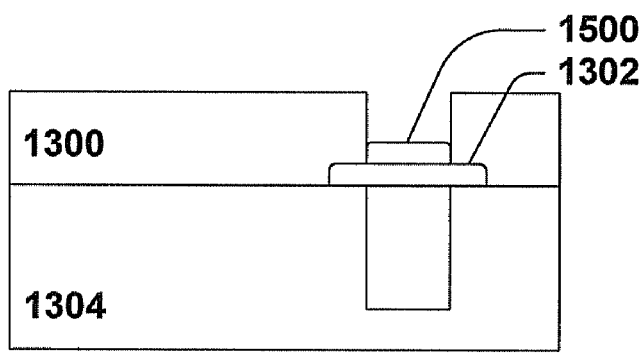
FIG. 15 illustrates forming an insulator in the opening on the bottom electrode in accordance with a fourth aspect of the subject invention.

FIG. 15 illustrates forming an insulator 1500 in the opening 1400 over a bottom electrode 1302. The insulator 1500 can contain any suitable electrically insulative material. For example, the insulator 1500 contains any of the materials described in connection with the insulator 200 in FIG. 2. The insulator 1500 can be formed over the bottom electrode 1302 by any suitable method, for example, thermal oxidation techniques, or deposition techniques such as CVD or spin-on techniques. For example, the insulator 1500 can be formed in the same manner described in connection with the insulator 200 in FIG. 2. In one embodiment, the insulator 1500 is formed on at least a portion of the top surface of the bottom electrode 1302. In another embodiment, the insulator 1500 is formed on the entire top surface of the bottom electrode 1302 (not shown).

Since the insulator can be formed after the formation of the bottom electrode 1302, the insulator 1500 is not exposed to any bottom electrode forming process (e.g., patterning a bottom electrode such as etching a bottom electrode). As a result, the insulator 1500 is not damaged by bottom electrode forming processes. For example, the insulator 1500 is not contaminated by an electrically conductive material of a bottom electrode.

Although not shown in FIGS. 13-15, the insulator 1500 can be formed prior to forming the protecting layer 1300. In one embodiment, the insulator 1500 is formed over the bottom electrode 1302, the protecting layer 1300 is formed over the substrate 1304, and then the opening 1400 is formed in the protecting layer 1300 on the bottom electrode 1302. Then opening 1400 can be formed by, for example, lithography and etching techniques. In this embodiment, since the opening 1400 is not exposed to the insulator forming process, the opening 1400 is not substantially damaged by the insulator forming process.

Figure 16:
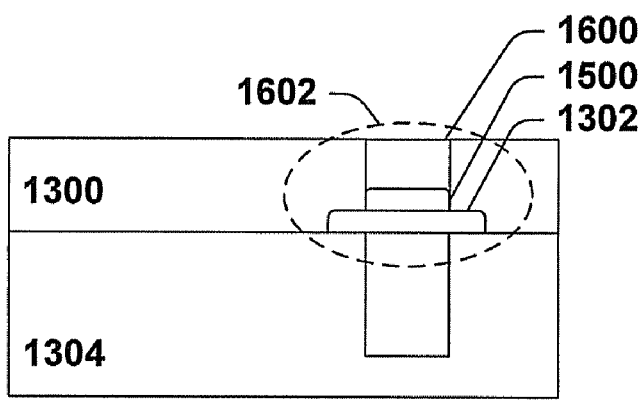
FIG. 16 illustrates forming a top electrode in the opening on the insulator in accordance with a fourth aspect of the subject invention.

FIG. 16 illustrates forming a top electrode 1600 in the opening 1400 over the insulator 1500, thereby forming a MIM structure 1602. In one embodiment, the MIM structure 1602 is a portion of a resistive memory cell (e.g., a resistive switching RAM such as ReRAM, RRAM, PCRAM, and the like). The top electrode 1600 can contain any suitable electrically conductive material. For example, the top electrode 1600 contains any of the materials described in connection with the bottom electrode 100 in FIG. 1. In one embodiment, the conductive material of top electrode 1600 is different from the conductive material of the bottom electrode 1302. In another embodiment, the conductive material of top electrode 1600 is the same as the conductive material of the bottom electrode 1302.

The top electrode 1600 can be formed by any suitable techniques. For example, the top electrode 1600 is formed by patterning a top electrode material in the opening 1400. In one embodiment, the top electrode 1600 is formed by forming a layer containing a top electrode 1600 material over the opening 1400 and removing unwanted portions of the top electrode layer such as the top electrode layer outside the opening 1400. The top electrode layer outside the opening 1400 can be removed by, for example, polishing or etching.

Since at least portions of the bottom electrode 1302 and/or insulator 1500 are covered with the top electrode material and the protecting layer 1300 during the top electrode forming process (e.g., patterning the top electrode 1600), the bottom electrode 1302 and/or insulator 1500 are isolated from the top electrode forming process. That is, the bottom electrode 1302 and/or insulator 1500 are not exposed to the top electrode forming process. As a result, the bottom electrode 1302 and/or insulator 1500 are not substantially damaged by the top electrode forming process. For example, since the interface of the bottom electrode 1302 and insulator 1500 is not exposed to the top electrode forming process, the bottom electrode 1302 and/or insulator 1500 are not substantially damaged by the top electrode forming process. In another embodiment, since edges and/or corners of the bottom electrode 1302 and/or insulator 1500 are covered with the top electrode material and the protecting layer 1300 during the top electrode forming process, the bottom electrode 1302 and/or insulator 1500 are not substantially damaged by the top electrode forming process.

Although not shown, the MIM fabrication processes described herein may further include any suitable semiconductor structure fabrication processes. General examples of semiconductor structure fabrication processes include masking, patterning, etching, planarization, thermal oxidation, implant, annealing, thermal treatment, and deposition techniques normally used for making semiconductor structures.

The MIM fabrication processes can be useful for any process for making a semiconductor device requiring MIM structures. The resultant MIM structure formed herein can be employed in any semiconductor devices, for example, central processing units (CPUs); input/output devices (I/O chips); and memory devices such as resistive memory devices (e.g., resistive switching RAM such as ReRAM, RRAM, PCRAM); and the like. The resultant MIM structure formed herein may be employed in MRAM (magnet-resistive random access memory).

The resultant MIM structure formed herein is useful in any electronic device such as a memory. For example, the resultant MIM structure embodied in a memory device is useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and lightweight of the memory devices. Examples of hand-held devices include cell phones and other two way communication devices, personal data assistants, Palm Pilots, pagers, notebook computers, remote controls, recorders (video and audio), radios, small televisions and web viewers, cameras, and the like.

What has been described above includes examples of the subject invention. It is, of course, not possible to describe every conceivable combination of components or methodologies for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "contain," "include," and "involve," are used in either the detailed description or the claims, such terms are intended to be inclusive in a manner similar to the term "comprising" as "comprising" is interpreted when employed as a transitional word in a claim.

What is claimed is:

1. A method of making a metal-insulator-metal structure on a substrate, comprising:
   forming a bottom electrode on the substrate;
   forming an insulator on the bottom electrode;
   forming a top electrode layer over the insulator, wherein an interface between the bottom electrode and insulator is not exposed to the top electrode layer forming process; and
   forming a top electrode by removing portions of the top electrode layer, wherein an interface of the bottom electrode and insulator is isolated from the top electrode forming process by covering the interface of the bottom electrode and insulator with the top electrode layer, a protecting layer, or combination thereof,
   with the proviso that patterning a two-layer structure comprising an insulator layer and metal layer is not performed.

2. The method of claim 1, wherein the bottom electrode is formed in an opening in the substrate.

3. The method of claim 1, wherein forming the insulator comprises growing an oxide on the bottom electrode.

4. The method of claim 1, forming the insulator comprises forming an insulator layer on the substrate and removing portions of the insulator layer.

5. The method of claim 4, wherein the bottom electrode is isolated from removing the portions of the insulator layer and the bottom electrode is not exposed to removing the portions of the insulator layer.

6. The method of claim 1, wherein the insulator is formed after the formation of the bottom electrode so that the insulator is not exposed to any bottom electrode forming process.

7. The method of claim 1, wherein the top electrode and the bottom electrode comprise different conductive materials.

8. The method of claim 1, the method comprising:
   forming the top electrode by removing portions of the top electrode layer, wherein all of the edge, corner, and interface of the bottom electrode and insulator are isolated from the top electrode forming process by covering the edge, corner, and interface of the bottom electrode and insulator with the top electrode layer, a protecting layer, or combination thereof.

9. The method of claim 1, the method comprising:
   forming the top electrode by removing portions of the top electrode layer, wherein the interface of the bottom electrode and insulator are isolated from the top electrode forming process by covering the interface of the bottom electrode and insulator with the top electrode layer.

10. The method of claim 1, the method comprising:
    forming the top electrode by removing portions of the top electrode layer by polishing or etching, wherein all of the edge, corner, and interface of the bottom electrode and insulator are isolated from the polishing or etching by covering the edge, corner, and interface of the bottom electrode and insulator with the top electrode layer, a protecting layer, or combination thereof.

11. A method for making a metal-insulator-metal structure on a substrate, comprising:
    forming a protecting layer over a bottom electrode and the substrate;
    forming an opening in the protecting layer on the bottom electrode;
    forming an insulator layer on the substrate and removing portions of the insulator layer;
    forming a top electrode on the insulator in the opening, wherein the bottom electrode, insulator, or combination thereof is isolated from the top electrode forming process by covering an edge, corner, and interface of the bottom electrode and insulator with the insulator, protecting layer, or combination thereof, and the bottom electrode, insulator, or combination thereof is not exposed to the top electrode forming process.

12. The method of claim 11 comprises:
    forming the insulator on the bottom electrode;
    forming the protecting layer over the bottom electrode and the substrate; and subsequently
    forming the opening in the protecting layer on the bottom electrode.

13. The method of claim 11, wherein the bottom electrode is formed in an opening in the substrate.

14. The method of claim 11, wherein forming the insulator comprises growing an oxide on the bottom electrode.

15. The method of claim 11 with the proviso that patterning a two-layer structure comprising an insulator layer and metal layer is not performed.

16. The method of claim 11, wherein the edge, corner, or combination thereof of the bottom electrode is rounded during forming the opening in the protecting layer.

17. The method of claim 11, wherein the top electrode and the bottom electrode comprise different conductive materials.

18. The method of claim 11, the method comprising:
    forming a top electrode by filing the opening with a top electrode material and removing the top electrode material outside the opening by polishing or etching, wherein the bottom electrode, insulator, or combination thereof is isolated from the polishing or etching by covering an edge, corner, and interface of the bottom electrode and insulator with the insulator, protecting layer, top electrode material, or combination thereof, and the bottom electrode, insulator, or combination thereof is not exposed to the top electrode forming process.

* * * * *